(12) United States Patent
Robinett

(10) Patent No.: US 9,620,204 B2
(45) Date of Patent: Apr. 11, 2017

(54) INTERCONNECTION ARCHITECTURE FOR MULTILAYER CIRCUITS

(71) Applicant: Hewlett-Packard Development Company, L.P., Houston, TX (US)

(72) Inventor: Warren Robinett, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 14/759,725

(22) PCT Filed: Jan. 18, 2013

(86) PCT No.: PCT/US2013/022262
§ 371 (c)(1),
(2) Date: Jul. 8, 2015

(87) PCT Pub. No.: WO2014/113024
PCT Pub. Date: Jul. 24, 2014

(65) Prior Publication Data
US 2015/0357034 A1    Dec. 10, 2015

(51) Int. Cl.
*G11C 13/00*    (2006.01)
*G11C 5/06*    (2006.01)
(Continued)

(52) U.S. Cl.
CPC .......... *G11C 13/0026* (2013.01); *G11C 5/025* (2013.01); *G11C 5/063* (2013.01);
(Continued)

(58) Field of Classification Search
CPC ............ G11C 2213/71; G11C 13/0007; G11C 13/0069; G11C 5/02; G11C 2213/72;
(Continued)

(56) References Cited

U.S. PATENT DOCUMENTS 6,478,231 B1    11/2002   Taussig
7,209,376 B2    4/2007    Saito et al.
(Continued)

FOREIGN PATENT DOCUMENTS

WO    WO-2010117355 A1    10/2010
WO    WO-2011019354 A1    2/2011
WO    WO-2011136795 A1    11/2011

OTHER PUBLICATIONS

Extended European Search Report dated Sep. 15, 2016; EP Application No. 13871450.6. pp. 9.
(Continued)

*Primary Examiner* — Hien Nguyen
(74) *Attorney, Agent, or Firm* — Fabian VanCott

(57) ABSTRACT

A computer readable memory includes a circuit layer, a multilayer memory stacked over the circuit layer to form a memory box, the memory box comprising a bottom surface interfacing with the circuit layer and four side surfaces, and a first switching crossbar array disposed on a first side of the memory box. A plurality of vias connects the circuit layer to the first switching crossbar layer. The first switching crossbar array accepts signals from the plurality of vias and selectively connects a crossbar in the multilayer memory to the circuit layer. A method for addressing multilayer memory is also provided.

9 Claims, 8 Drawing Sheets

(51) Int. Cl.
*G11C 5/02* (2006.01)
*G11C 8/12* (2006.01)
*G11C 7/18* (2006.01)
*G11C 8/10* (2006.01)
*G11C 8/14* (2006.01)

(52) U.S. Cl.
CPC .................. *G11C 7/18* (2013.01); *G11C 8/10* (2013.01); *G11C 8/12* (2013.01); *G11C 8/14* (2013.01); *G11C 13/004* (2013.01); *G11C 13/0028* (2013.01); *G11C 13/0069* (2013.01); *G11C 2213/71* (2013.01)

(58) Field of Classification Search
CPC ............ G11C 2213/77; G11C 13/0097; G11C 11/5685; G11C 13/0004; G11C 2213/79; G11C 5/06
See application file for complete search history.

(56) References Cited

U.S. PATENT DOCUMENTS

| | | |
|---|---|---|
| 7,233,024 B2 | 6/2007 | Scheuerlein et al. |
| 7,982,504 B1 | 7/2011 | Robinett |
| 8,565,003 B2 * | 10/2013 | Siau .................... G11C 11/5685 365/148 |
| 2010/0133587 A1 | 6/2010 | Wang |
| 2012/0051125 A1 | 3/2012 | Yang et al. |
| 2012/0098566 A1 | 4/2012 | Robinett |
| 2012/0147650 A1 | 6/2012 | Samachisa et al. |
| 2013/0223133 A1 * | 8/2013 | Azuma .............. G11C 13/0007 365/148 |

OTHER PUBLICATIONS

CN First Office Action dated Oct 25, 2016, CN Patent Application No. 201380056770.1 dated Jan 18, 2013, State Intellectual Property Office of the P.R. China, 5 pages.

Cheng, K-T. et al., 3D CMOS-Memristor Hybrid Circuits: Devices, Integration, Architecture, and Applications, ISPD '12, Mar. 25-28, 2012, Napa, CA, 8 Pages.

International Searching Authority, The International Search Report & Written Opinion, Jan. 22, 2014, 9 pages.

* cited by examiner

INTERCONNECTION ARCHITECTURE FOR MULTILAYER CIRCUITS

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Figure 1A:
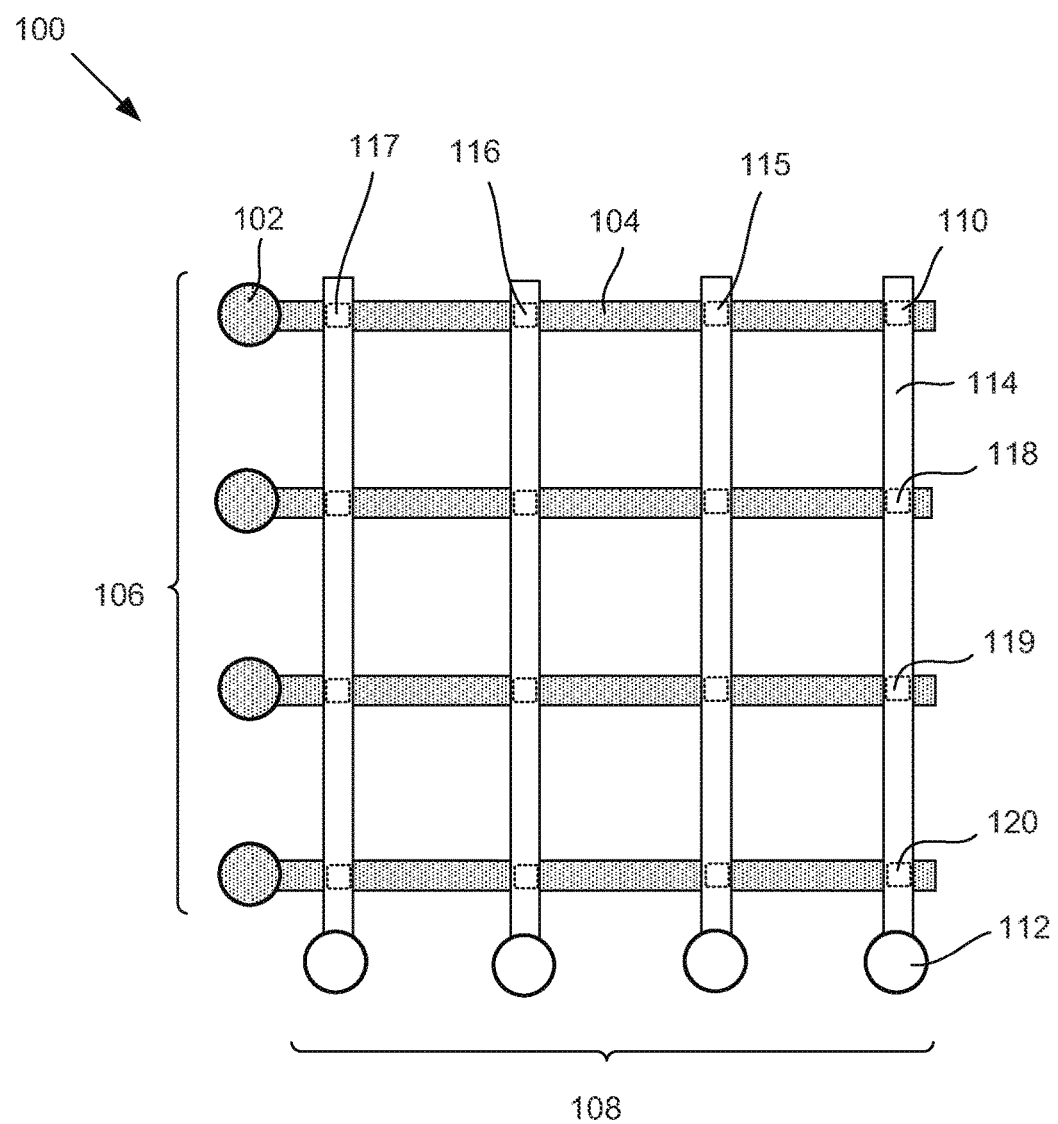
FIG. 1A-1C are diagrams of an illustrative crossbar circuit, according to one example of principles described herein.

One solution for increasing the performance and planar density of integrated circuits is to create three dimensional circuits which contain multiple layers of interconnected circuitry. However, addressing elements within these three dimensional circuits can be challenging due to the greatly increased number of elements and reduced surface area. For example, a three dimensional circuit may contain multiple layers of memristive crossbars that are addressed by an underlying layer of CMOS addressing circuitry. Due to the density of the memristors in the three dimensional circuit, it becomes challenging to provide the necessary addressing circuit and interconnection vias necessary to address the memristors in a footprint comparable to the size of the 3D memristor circuit. Further, as the number of devices/layers in the three dimensional circuit increases, the number of addressing vias/lines also increase. The presence of vias in the three dimensional circuit decreases the area available for crosspoint devices.

The principles described below relate to multidimensional addressing schemes that can dramatically increase the number of memristor devices that can be addressed with a given number of addressing circuits and vias. This results in memory circuits with greater capacities and smaller footprints. In one implementation, a six dimensional (6D) addressing scheme is described that uses CMOS level multiplexers and incorporates stages of transistor-like addressing devices to address memory elements in the three dimensional circuit. In some examples, the transistor-like addressing devices are crossbar arrays located in or on the sides of the multilayer memory circuit. These new access arrays can include any controllable switch which can be placed on the crossbar memory layers—such as thin-film transistors, thermal-effect transistors, negative differential resistance (NDR) devices, memristor-based analog switches or any device or circuit in which a control wire can be used to control the conductance between two other wires.

This 6D addressing scheme can address more bits than 4D addressing, when using a fixed amount of CMOS resources. For example, using 240 CMOS/via units, a 4D addressing scheme can address about 13 Mb ($60^4$ bits) and a 6D addressing can address 729 Mb ($30^6$ bits). For a fixed number of bits B to be accessed, 6D addressing requires fewer vias ($V=4B^{1/3}$) than 4D addressing ($V=2B^{1/2}$). This increased wiring efficiency makes it possible to create smaller multilayer circuits. The 6D addressing scheme has an additional advantage that it reduces the capacitance driven by the CMOS circuitry. A third advantage is that there are no "holes" in the address space, meaning that there is a one-to-one correspondence between addresses and physical memory cells for some implementations.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

FIG. 1 is a diagram of an illustrative crossbar circuit (100). According to one illustrative example, the crossbar circuit (100) includes an east/west array of crossbars (106) that are intersected by a north/south array of crossbars (108). Each of the crossbars (106) are connected to a via (102) The crossbars may be a nanowire, microwire, or larger wire. For convenience, east/west crossbars (106) are called row crossbars and north/south crossbars (108) are called column crossbars. At each intersection between a row crossbar and a column crossbar, a programmable crosspoint device is sandwiched between the two intersecting crossbars. For example, when a row crossbar (104) intersects a column crossbar (114), a programmable crosspoint device (110) is sandwiched between the row crossbar (104) and the column crossbar (114). Although the row crossbars (106) and column crossbars (108) are illustrated as making perpendicular intersections, the row crossbars (106) and column crossbars (108) may intersect at any nonzero angle. Saying that two crossbars intersect means that they cross, when viewed from above (not that they interpenetrate), and that they are close enough, at their point of nearest approach, to form a sandwich using an programmable cross point device (110) as the "meat" and the two crossing crossbars (104, 114) as the upper and lower "buns".

To write to the programmable crosspoint device (110), a voltage difference or other electrical stimulus is present between the crossbars (104, 114). All other crossbars are put at an intermediate voltage. At the intersection between the crossbars (104, 114), the voltage is sufficient to change the state of the programmable crosspoint device (110), which is called the "selected device." The remaining crosspoint devices (115-120) attached to either of the crossbars (104, 114) see only a portion of the full applied voltage drop because one via is at the intermediate voltage. Crosspoint devices which only see a portion of an applied voltage because they are attached to only one activated via/crossbar are called "half selected." The state of the half selected crosspoint devices (115-120) does not change because they do not see full writing voltage. The unlabeled crosspoint devices in FIG. 1A are non-selected devices. The non-selected devices are not connected to either the selected row or the selected column crossbars.

To read a given programmable crosspoint device (110), a number of techniques can be used. According to one illustrative example, a reading voltage is applied to two intersecting crossbars (104, 114). The reading voltage is sufficiently lower than the writing voltage so that there is not a significant change in the state of the programmable crosspoint devices during the reading operation. By applying the reading voltage and measuring the amount of current which flows through the programmable crosspoint device (110) at the intersection between the crossbars (104, 114), its state can be determined.

In one example, the programmable crosspoint devices (110) contained in the crossbar circuit (100) may be a memristor memory cell. Unlike Flash memory, a memristive memory cell contains no field-effect transistors (FETs), and this opens up the possibility of building memristive crossbar memories with multiple layers, thus increasing memory density by stacking in Z, or vertical, direction, rather than by decreasing the lateral size of the memory cell, which is becoming increasingly difficult to do.

Figure 1B:
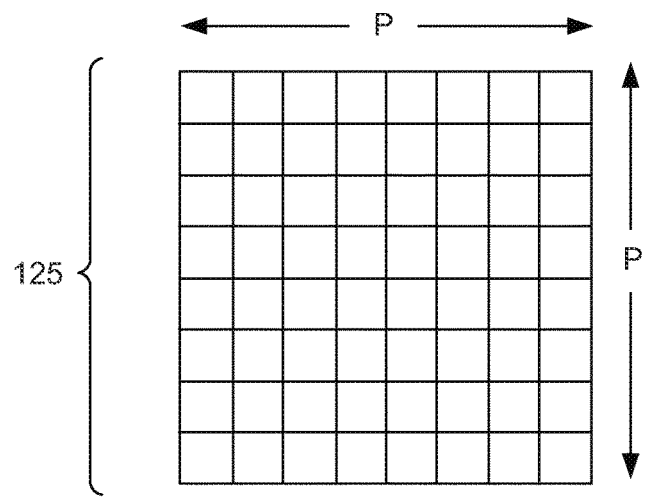
Figure 1C:
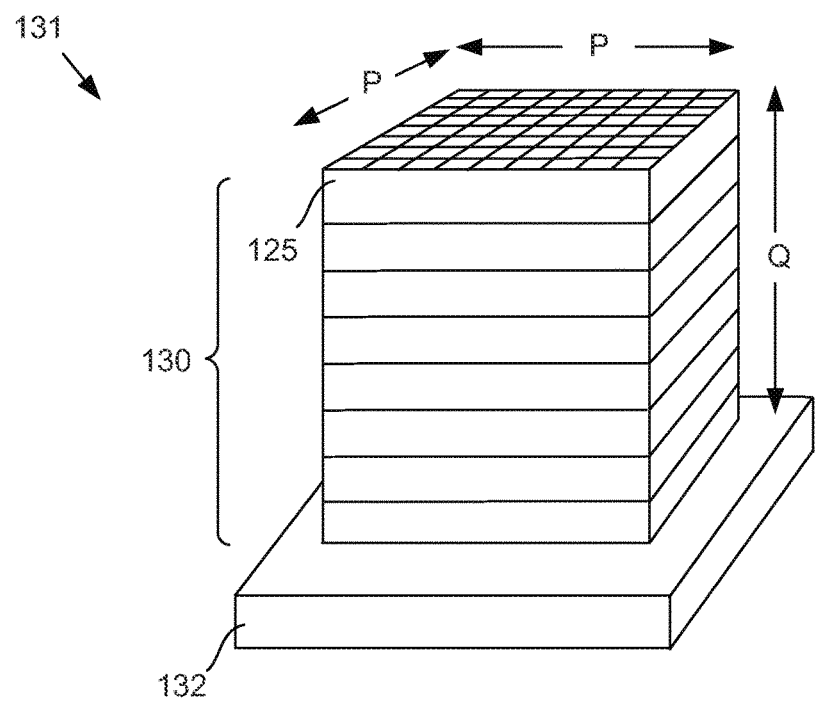

FIG. 1B is a diagram of an illustrative crossbar layer (125) which has two arrays of P nanowire crossbars, which intersect at $P^2$ crosspoints. Programmable crosspoint devices (110, FIG. 1A) are placed between the crossbars at each intersection. FIG. 1C is a diagram of an illustrative crossbar stack (130) which is formed on an underlying CMOS layer (132) to create a computer readable memory (131). The crossbar stack (130) includes Q crossbar layers (125). As discussed below, this crossbar stack (130) can incorporate a variety of interconnection architectures, including interconnection architectures such that each programmable crosspoint device (110, FIG. 1A) is uniquely addressed and every address within a contiguous address space accesses a programmable crosspoint device (110, FIG. 1A). In one example, the crossbar stack (130) has P layers (Q=P) each with $2P^2$ crossbars and $P^3$ crosspoint devices. This is P×P×P crossbar stack. In other examples, the crossbar stack (130) may contain more or less layers and may not have a one-to-one correspondence between addresses and crosspoint devices or a contiguous address space. A number of vias extend upward from the CMOS into the crossbar layers. The vias provide electrical connectivity between the CMOS and crossbar layers.

In other implementations, the crossbar array may not be square and the crossbar stack may not cubic. For example, the crossbar array may be rectangular ($P_1 \times P_2$). The crossbar stack may have more or less layers than the number of rows/columns in a crossbar array ($P_1 \times P_2 \times M$). Thus, the crossbar stack is most generally defined as a box with dimensions (Q×R×S) where Q is the number of crossbar rows each array, R is the number of crossbar columns in each array, and S is the total number of stacked arrays. A special case of this crossbar box is a cube where Q, R, and S are all equal. The crossbar cube may have a number of advantages including a more efficient wiring and addressing schemes.

However, there are a number of challenges to overcome in achieving this goal of multi-layer memristive memory. The ratio of vias-to-memristors must be kept low; otherwise the density advantage of the multilayer circuit is lost. One way to reduce the ratio of vias-to-memristors is to use very large crossbars arrays (very long crossbars connected to many memristors). But using large crossbar arrays introduces electrical-engineering problems, such as leakage through half-selected devices in the write operation, difficulty in isolating the target device in the read operation, and large capacitive loads to be driven. If additional vias are required as the number of memory layers increase, this worsens the issues described and limits the number of memory layers which are feasible to use.

The table below describes the number of crosspoint devices that can be addressed using a fixed number of vias driven by CMOS components (240 CMOS components in this example).

TABLE 1

| Dimensions | Architecture | Number of vias | Devices addressed |
| --- | --- | --- | --- |
| 2D | 120 × 120 | 240 = 2 × 120 | 14,400 |
| 3D | 80 × 80 × 80 | 320 = 4 × 80 | 512,000 |
| 4D | 60 × 60 × 60 × 60 | $7200 = 2 \times 60^2$ | 12,960,000 |
| 6D | $30^8$ | $3600 = 4 \times 30^2$ | 729,000,000 |

As can be seen from Table 1, principles described herein to create a 6D addressing architecture provide significantly higher addressing performance. As described below, the 6D addressing architecture incorporates the upper memristor layers. By putting active devices in the upper layers, fewer vias and few CMOS devices are needed to address larger numbers of crosspoint devices.

Figures 2A, 2B:
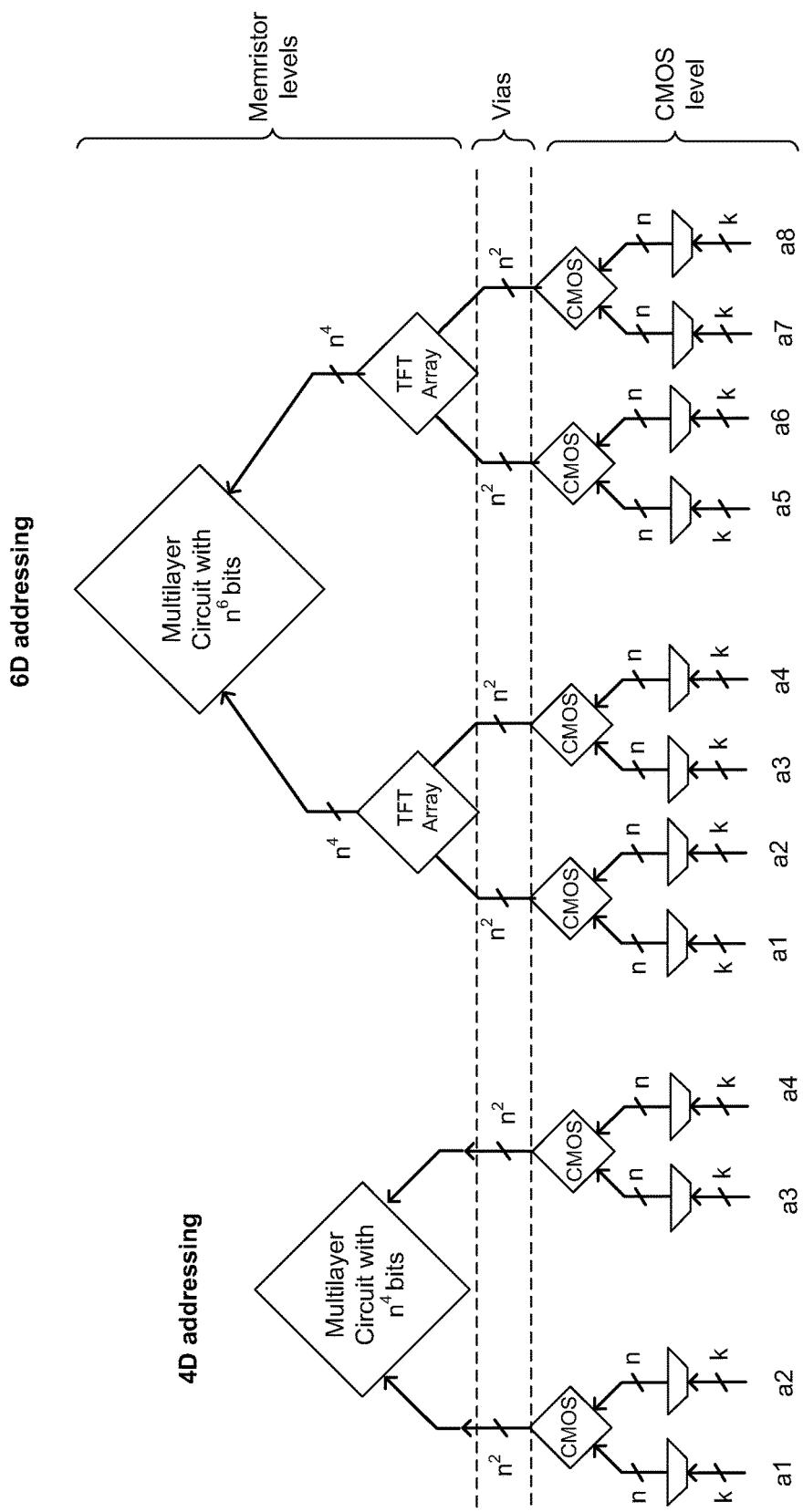
FIGS. 2A-2B compare architectures of 4D and 6D addressing schemes, according to one example of principles described herein.

FIGS. 2A-2B show a comparison of a 4D architecture that lacks active addressing devices in the upper layers and a 6D architecture that includes active addressing devices in the upper layers. In FIG. 2A, k input lines are connected to four multiplexers/demultiplexers (hereafter referred to as "multiplexers" for conciseness), for a total of 4 k addressing lines. A binary address is transmitted over the 4 k addressing lines to the demultiplexers to decode an address. In the description below, each of the demultiplexers are connected to n output lines. The variable n refers to the number of output lines from the multiplexers, not to the number of row or column crossbars in the array.

Using the binary address supplied on each of k lines, each of the demultiplexers selects one of the n output lines. Thus, the input of the 4 k address results in the selection of four lines out of the 4n lines leaving the demultiplexers. The relationship of k and n for a binary address is $k=\log_2 n$. These 4n lines are connected to CMOS circuitry that selects two lines out of the $2n^2$ vias that pass upward into the multilayer circuit. These $2n^2$ vias physically address the individual memristors in the array. As discussed above, the number of bits that can be addressed is $n^4$.

FIG. 2B shows an implementation for 6D addressing. In this example, there are 8 k input lines, which is (for a fixed k) twice the number of input lines for the 4D addressing scheme shown in FIG. 2A. The 8 k output lines from the multiplexers connect to the CMOS circuitry. Each of the multiplexers, upon receiving a k bit address, selects one of n output lines. Two of the lines are connected to each CMOS unit, which activates one of $n^2$ vias. The $4n^2$ vias do not directly connect to the crosspoint memory devices. Instead, the $4n^2$ vias connect to intermediate addressing units in the upper layers of the circuit. Each of these intermediate addressing units is connected to, and selectively activates, $n^4$ crossbars. For example, the intermediate addressing units may be thin film transistor (TFT) crossbar array located on the sides of the memory stack. The intermediate addressing units select a pair of the $2n^4$ crossbars to address one of the $n^6$ crosspoint devices in the multilevel memory.

The multiplexers shown in FIG. 2B are drawn with direction arrows suitable for demultiplexing during the write operation. However, a memory device performs both read and write operations. The TFT arrays, CMOS transistor crossbars, and multiplexers include bidirectional switching. Using such switches, in the read operation, a voltage source in the CMOS layer is routed to a selected row on one of the upper layers, and a selected column is routed down to a sense amplifier in the CMOS layer; and it is thus possible to assess the resistance state of the memristor at the intersection of these two wires. In the write operation, both the selected row and selected column are driven by voltage sources in the CMOS layer. Therefore, both the multiplexers, CMOS transistors and TFT crossbars use bi-directional, analog switches in their implementations.

In the block diagram of 6D addressing (FIG. 2B), there are actually four different representations used for the location (i.e., address) of a memory bit in the multilayer memory (a "memory cube"). These different address representations are:
  Rep A ($n^4$-bit unary). Two $n^4$-bit vectors in which exactly one bit is ON in each vector.
  Rep B ($n^2$-bit unary). Four $n^2$-bit vectors in which exactly one bit is ON in each vector.
  Rep C (n-bit unary). Eight n-bit vectors in which exactly one bit is ON in each vector.
  Rep D (binary). Eight k-bit vectors with any combination of 1s and 0s, where $k=\log_2 n$.

Rep A is the representation required to access a bit in a crossbar. For example, when writing a bit in a crossbar, most of the row and column wires are held at Ground (OFF), while the selected row is energized to a particular voltage (for example: +V) and the selected column is driven to −V. These two wires with non-zero voltages are ON. The memory cube has $n^4$ row wires, and also $n^4$ column wires. Thus each $n^4$-bit vector represents the voltages on a set of $n^4$ parallel wires in the memory cube (either all row wires or all column wires). Each bit in these vectors represents the voltage on a single row or column wire: 0 represents a wire which is OFF (grounded and inactive), and 1 represents a wire which is ON (driven to a non-zero voltage, and in use to determine which bit is to be written).

The Rep D representation is a binary address. A binary address is the form in which addresses are supplied from an external source to a memory. After receiving an 8 k-bit address, it can be partitioned into k-bit sub-words. The architecture shown in FIG. 2B converts the Rep D address representation to the Rep A address representation by means of two intermediate address representations, namely, Rep B and Rep C. In more detail, the sequence of operations is as follows.
  Rep D is the conventional binary address of the target memristor, which is the external interface used by the memory system. An external source supplies this binary address.
  The eight multiplexer/demultiplexer circuits at the bottom of FIG. 2B convert from binary addresses (Rep D input) to n-bit unary addresses (Rep C output).
  In the bottom crossbar stage, the transistor crossbars convert from a pair of n-bit unary addresses (Rep C input) to an $n^2$-bit unary address (Rep B output).
  In the middle crossbar stage, the TFT crossbars convert from a pair of $n^2$-bit unary addresses (Rep B input) to an $n^4$-bit unary address (Rep A output).
  In the top stage, two Rep A addresses are used to access a bit (for example a resistive memory element such as memristor) in the memory cube. To write a bit, the ON-bits in the two vectors indicate which row crossbar and column crossbar are to be selected. The selection of a row crossbar and a column crossbar controls which bit has the write-threshold voltage put across it. To read a bit, the selected row crossbar has a small voltage driven onto it, and the selected column crossbar becomes part of the path by which the sense amplifier is electrically linked to the bit being read. The sense amplifier determines the resistance state of the selected bit.

Figure 3A:
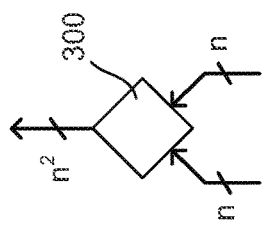
FIGS. 3A-3D describe various aspects of a 6D addressing architecture, according to one example of principles described herein.
Figure 3B:
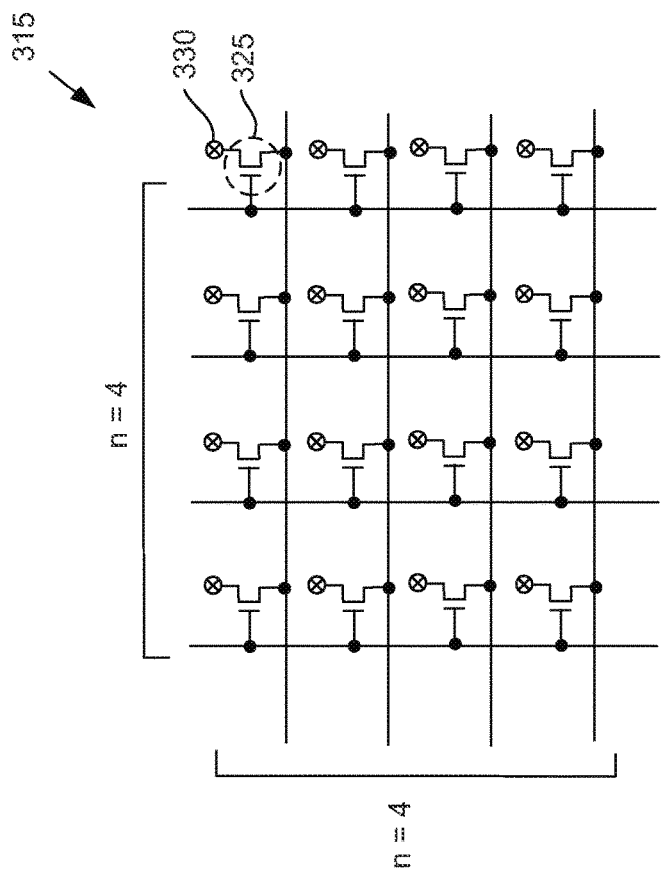
Figure 3C:
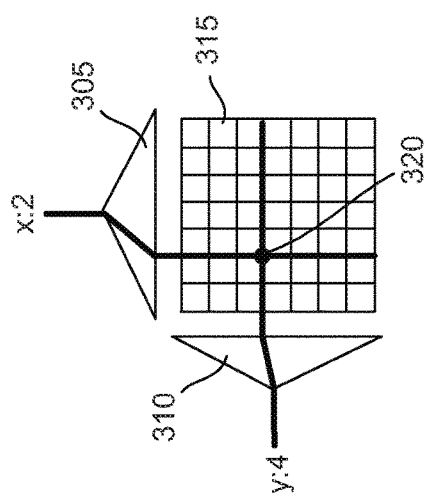

FIGS. 3A-3D describe the operation of multiplexers and the CMOS crossbar array in selecting vias/wiring connected to the multilayer memory circuit. As shown in FIG. 3A, a CMOS crossbar array (300) containing two sets of n input signals can control or access $n^2$ target locations. These target locations can either contain an item of interest (for example, a memristor), or can be intermediate signals that are conveyed by wiring to subsequent stages of the overall system. In the case of 4D addressing (FIG. 2A), the architecture includes two stages. In the first stage, there are two transistor-based crossbars in the CMOS layer, which each have a pair of n-bit input vectors, and an $n^2$-bit output vector. The simplified illustration of FIG. 3B shows a CMOS crossbar (315) with 2n inputs where n=4. The CMOS crossbar (315) includes a transistor (325) at each crossbar intersection. The transistors can be selectively activated to make a connection to vias (330). Each CMOS crossbar controls $n^2$ via outputs. FIG. 3C shows two multiplexers (305, 310) selecting one CMOS device (320) in the CMOS crossbar array (315). The y multiplexer (310) on the left has selected line 4 and the x demultiplexer (305) on top has selected line 2. The CMOS device (320) at the intersection of these two lines is activated.

Figure 3D:
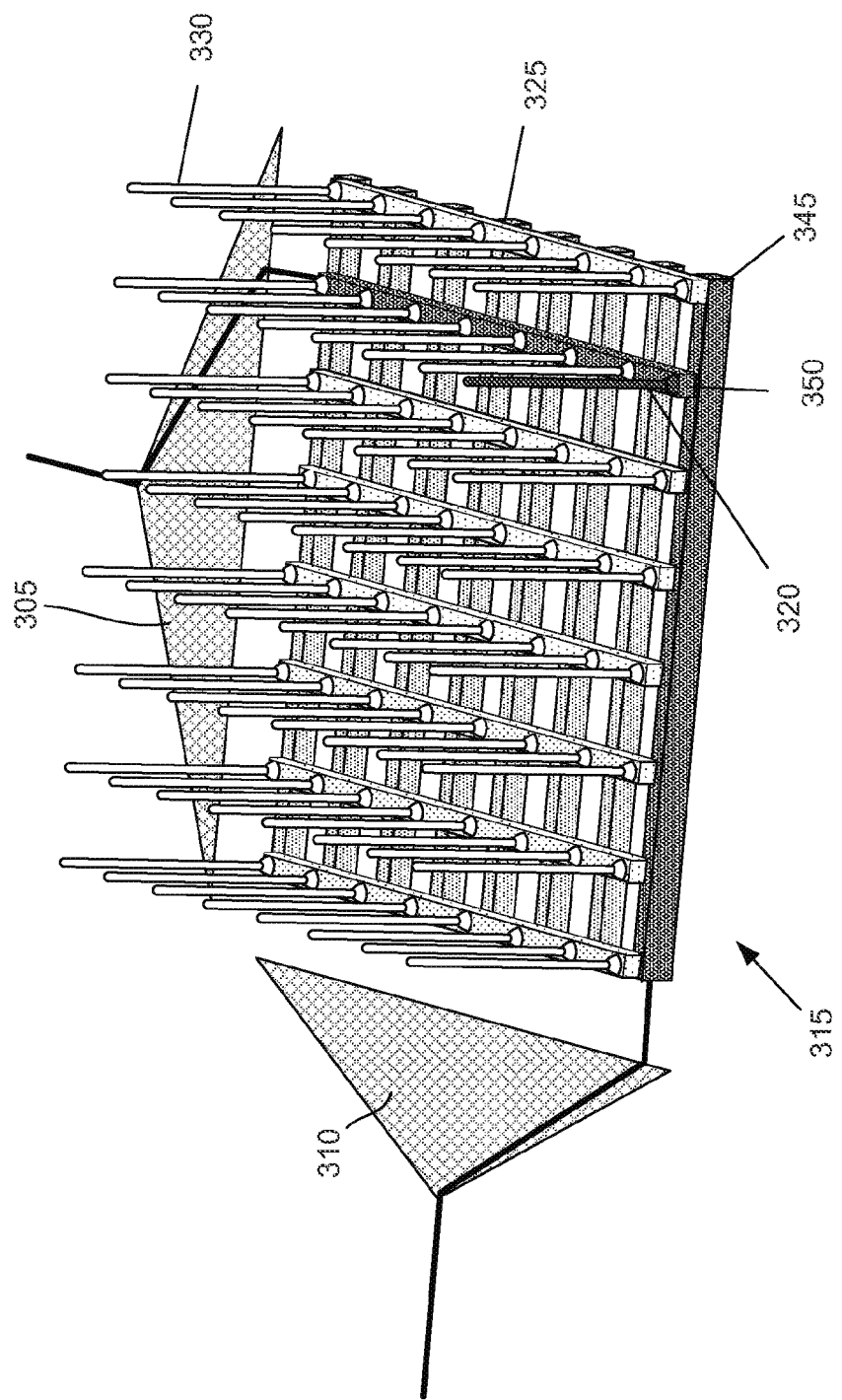

FIG. 3D shows a perspective view of this bottom stage, with multiplexers (305, 310) on the left and top and the CMOS transistor crossbar (315) in the middle. As discussed above, the CMOS transistor crossbar (315) includes intersecting crossbars with a transistor (325) at each intersection. Vias (330) are connected to each of the CMOS transistors (325), to carry signals produced/switched by the CMOS devices into the multiple layer crosspoint circuit overlying the CMOS circuitry. In this example, the Y decoder (310) has received an address that indicates the selection of a Y crossbar (345) closest to the bottom of the figure. The X decoder (305) received an address that is indicates the selection of an X crossbar (350). The selected via (320) is at the intersection of the selected crossbars (345, 350).

In FIG. 2A there are two CMOS crossbars, each with $n^2$ outputs. These $2n^2$ output signals are conveyed by $2n^2$ vias to the memristor levels. The two $n^2$-bit vectors then become the inputs to the second stage, which is topologically an $n^2 \times n^2$ crossbar containing (at most) $n^4$ memristors as the target bits.

To form one implementation of the 6D addressing architecture shown in FIG. 2B, the demultiplexers and transistor crossbar arrays shown in FIG. 3C are used as bottom stages. The bottom stages are transistor-based crossbars in the CMOS layer with two n-bit inputs and an $n^2$-bit output.

However, the number of these transistor crossbars is doubled, from two in the 4D design to four in the 6D design. Thus, in 6D addressing, there are $4n^2$ vias carrying the output signals from the bottom stage to the upper stages.

A middle stage is added to the 6D design. The middle stage is a crossbar array that operates similarly to the bottom stage transistor-based crossbars, but one that can be implemented on the upper levels of the memory system. In this disclosure, a thin-film transistor (TFT) is used for this purpose. But alternatively, there may be other forms of such a switch, built from memristors or NDR devices, which perform this function. The middle stage accepts $2n^2$ inputs and selects two of $n^4$ outputs.

The top stage of the 6D design is multiple layers of memristive crossbars with $2n^2$ inputs from the middle stage to address the $n^6$ crosspoint devices it contains. The address of the target bit is represented in different forms in the successive stages of the circuits shown in FIG. 2B. A compact, binary address is used as the initial input, but sparse, unary representations are used as input to each of the crossbars. For example, in a j-bit unary representation, only one of the j bits is a one; all the rest are zeroes.).

Figure 4:
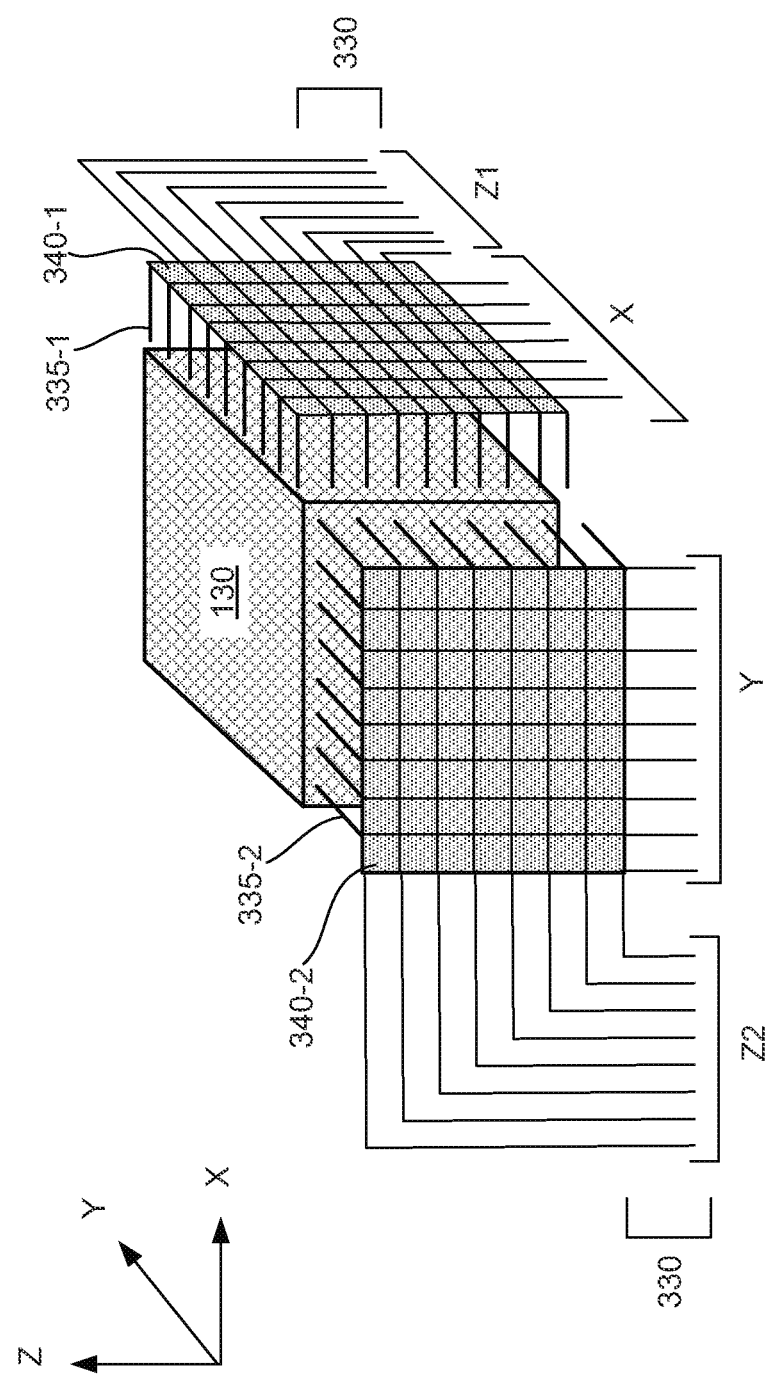
FIG. 4 is a three dimensional diagram of a 6D addressing architecture, according to one example of principles described herein.

FIG. 4 shows one implementation of the middle and upper stage of a memory device with a 6D addressing architecture. The vias (330) from each of the two CMOS crossbar arrays extend upward to address two thin film transistor (TFT) arrays (340) formed on the sides of a multilayer crosspoint memory (130). Signals carried by the vias (330) select two intersecting crossbars in each of the TFT arrays (340). The TFT arrays (340) are connected to each of the crossbars (335) in the multilayer memory (130). For example, the X TFT crossbar array (340-1) is connected to the row crossbars (335-1) that pass through the multilayer memory (130) parallel to the X axis. The Y TFT crossbar array (340-2) is connected to the column crossbars (335-2) that pass through the multilayer memory (130) parallel to the Y axis. To access a specific memory element in the multilayer memory (130), the TFT crossbars select the appropriate crossbar and the appropriate intersecting Y crossbar. The memory device that is at the intersection between the X crossbar and the Y crossbar is the selected memory device. This selected memory device can then be programmed or read. Each crosspoint device in the multilayer memory circuit can be uniquely selected by inputting an binary address, demultiplexing the address and inputting it to a CMOS array to select a via, then using the TFT connect to the vias to select a crossbar.

For a specific implementation of the crossbar array, several principles for the wiring geometry of 6D addressing are as follows:

Above the bottom CMOS layer, there are $n^2$ stacked layers of $n^2 \times n^2$ memristive crossbars. This memory stack thus contains $n^6$ memristors. Its geometry is that it is an $n^2 \times n^2 \times n^2$ cube. From each of the four sides of this cube, there is an $n^2 \times n^2$ array of crossbar wires accessible.

Two of the middle stage crossbars (built from TFTs) are attached to two sides of the memory cube. This is shown in FIG. 4. The outputs of these two intermediate crossbars will be perpendicular to one another. The $n^4$ outputs of one TFT crossbar will drive the row wires (which are parallel to the X-axis) in the memory stack. The $n^4$ outputs of the other TFT crossbar will drive the column wires (parallel to the Y-axis) in the memory stack.

Each TFT crossbar needs two sets of $n^2$ inputs. These signals come up on vias from the CMOS layer, as the outputs of the four bottom stage crossbars. As shown in FIG. 4, these signals are wired such that the signals come up on vias which are in a straight line, like a row of fence posts. The "fence-row" of vias labeled X and Y continue straight up into their respective TFT crossbars. The other two fencerows, labeled Z1 and Z2, have their vias go upwards and then make a sweeping 90-degree turn, so as to connect to its TFT crossbar.

Thus, the wiring scheme is that one TFT crossbar controls the rows (wires parallel to the X axis) in the memory cube. This TFT crossbar is called the row-selector TFT crossbar. The other TFT crossbar controls the columns (wires parallel to the Y axis) in the memory cube. This TFT crossbar is called the column-selector TFT crossbar. Thus, as shown in FIG. 4, each row wire has a two-part address (y, z2). Likewise, each column wire has a two-part address (x, z1). In this example, z1=z2, so that the row selected by the row-selector TFT crossbar and the column selected by the column-selector TFT crossbar are on the same levels of the memory cube.

Therefore, with this wiring scheme, the z1 and z2 addresses are redundant. To access physical memory bits, the part of the address labeled z1 must be equal to the part of the address labeled z2. Even though there are $n^8$ possible addresses, there are only $n^6$ physical memristors in the memory cube. Thus, it is more appropriate to call this a 6D addressing scheme than an 8D addressing scheme. This scheme also produces a simple wiring geometry in which many of the wires are straight lines. Each memristor in each crossbar layer has a well-defined (x,y,z) address. Coordinates x and y are unconstrained, but the same z address must go to both the z1 and z2 inputs to the TFT crossbars. The implementation shown in FIGS. 3A-3D and FIG. 4 is only one example. A variety of other configurations could be used. For example, one of the redundant address groups (z1 or z2) may be connected to both TFT crossbar arrays and other redundant address group can be eliminated.

Figure 5A:
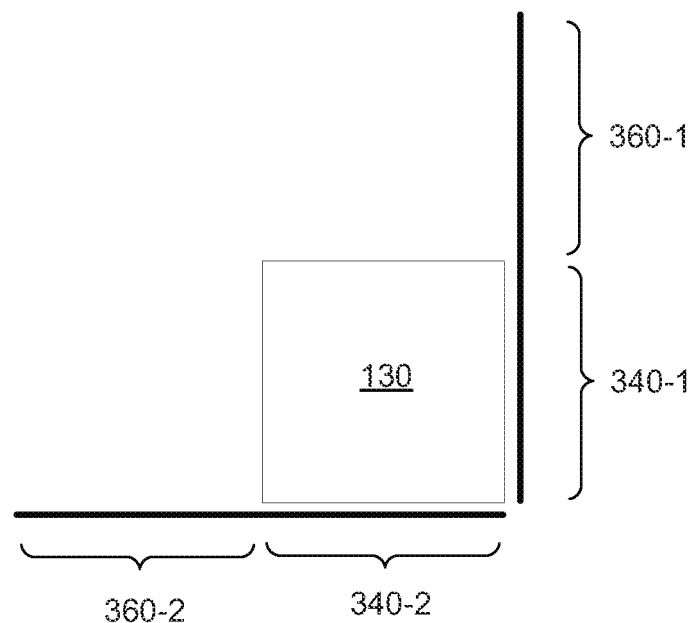
FIGS. 5A-5B show wrapping of via wings around a three dimensional block of memory, according to one example of principles described herein.
Figure 5B:
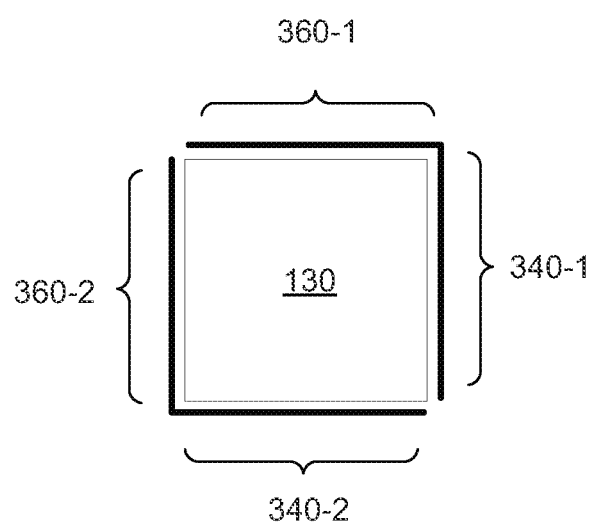

The topology shown in FIGS. 2B, 3A, 3B, 3C and 4 can be simply and efficiently embedded in 3D space. FIGS. 5A and 5B show one configuration for embedding the topology into a 3D space. Leaving aside the bottom CMOS level of the system for the moment, this memory system includes:

the $n^2 \times n^2 \times n^2$ multilayer memory cube, and two thin "wings", which contain the two TFT crossbars and their associated vias, with each wing having dimensions $2n^2 \times n^2 \times 1$.

A top view in FIG. 5A shows the footprint of the system, in which the wings (360) extend from the TFT crossbars (340) on the sides of the multilayer memory cube (130). This makes the shape somewhat awkward for packing. However, as shown in FIG. 5B, the wings (360) can be folded around the cube such that the entire structure has a square footprint, covering an area of $(n^2+2) \times (n^2+2)$.

Returning to the CMOS level circuitry (the four n×n transistor crossbars and their associated mux/demux circuits), the above-described "folded-wings" wiring geometry fixes the positions of the $4n^2$ vias as four straight "fence-rows" of $n^2$ vias along each of the four sides of the memory cube. These $4n^2$ signals are the outputs of the four n×n transistor crossbars.

These four n×n transistor crossbars (area $4n^2$) should fit beneath the memory cube's $n^2 \times n^2$ footprint (area $n^4$), assuming that (1) the wire pitches are the same in the CMOS and in the memristive crossbars in the memory cube, and (2) that $n \geq 8$. For n=8, the four transistor crossbars would consume 1/16 of the area beneath the memory cube. Thus, for a wide range of realistic values of n and comparable CMOS/via/crossbar pitches the CMOS circuitry can fit underneath the memory cube footprint.

However, some structures needed by a memory system can require substantial area, such as sense amplifiers and driver circuits. If it is the case that the required area of these circuits is greater than the remaining area beneath the memory cube, a way to handle this is to share the sense amplifier or other circuitry between several memory cubes. This allows the area of such large circuits to be "amortized" across several memory cubes. The access devices in the four transistor crossbars cannot be shared in this way; but a careful examination of the circuitry reveals which subcircuits are shareable, and which are not.

In the examples above, the 6D addressing scheme has been presented at its maximum ($n^6$) capacity. But it also works if fewer than $n^2$ layers use used. In this case, the TFT crossbars would be rectangular, not square. The 6D addressing scheme has advantages over 4D addressing for any number of layers greater than one. It is perfectly feasible to build a 6D-addressing memory system using, for example, 64×64 memristive crossbars, with 64 layers, or 32, or 16, or 8, or 4, or 2. If there is only one layer, 6D addressing offers no advantage. As the number of layers increases, the benefit of using 6D addressing increases.

The 6D addressing scheme offers some powerful advantages, as discussed below. In this discussion, the following assumptions can be made. Memory systems normally use sizes which are powers of 2. Consequently, the analysis below is limited to these sizes. Further, it is assumed that the memory stack has dimensions H×W×W. For full 6D addressing, H=W; for partial 6D addressing and 4D addressing, H and W are independent. The height H and the width W are assumed to be powers of 2. Thus, the memory stack is composed of H layers, and has a square W×W footprint. Each layer is a W×W memristive crossbar. A single tile (containing one memristor) from the crossbar is used as a unit of area, and also as a unit of volume. The tile is assumed to contain 1 bit. Further, it is assumed that the wire pitch for vias and CMOS wires is the same. A via is assumed to go straight up, and penetrate all layers. Thus a via occupies 1 unit of area, but H units of volume (in which H bits might otherwise have been stored). These assumptions are given only as an example and do not limit the principles or claims.

The variables for comparing a full 6D addressing architecture to a 4D addressing architecture are:
the number of bits k in each of the binary addresses which are inputs to the eight multiplexers (bottom of FIG. 2B), which therefore each have $2^k$ outputs;
the number of wires $n=2^k$ used in each of the n×n transistor crossbars;
the number of vias V, which go from the CMOS layer to the upper memristor layers;
the number of bits B which can be accessed by the memory system;
the area A of the memory system's footprint (not counting the vias); and
the ratio V/A, which measures the relative area consumed by vias versus memristors.

Some relationships that are true, by definition, are as follows.
The number of bits B=H×W×W.
The area of the memory stack's footprint is A=W×W.
From the two equations above, it follows that A=B/H.
The 6D addressing architecture reduces the number of vias required for a given memory size. The number of vias V required to address B bits is:

for 4D addressing, $V=2B^{1/2}$; and
for 6D addressing, $V=4B^{1/3}$.

For example, to access $B=2^{24}$ bits, 4D addressing requires $V=2^{13}=8192$ vias; whereas 6D addressing requires $V=2^{10}=1024$ vias. The reduction in the number of vias results in an improvement in wiring efficiency ratio V/A. The improved wiring efficiency then leads to a further advantage.

The 6D addressing architecture allows smaller crossbars to be used and to have as many stacked layers as desired. Whereas in 4D addressing, adding layers forces the crossbar to grow larger. Table 2 summarizes this relationship.

TABLE 2

Feasible Crossbar Sizes for 4D and 6D Addressing.

| | smallest crossbar W × W with V/A < 0.10 | |
|---|---|---|
| # layers H | 4D addressing | 6D addressing |
| 1 | $2^6 \times 2^6$ | $2^6 \times 2^6$ |
| 4 | $2^7 \times 2^7$ | $2^6 \times 2^6$ |
| 16 | $2^8 \times 2^8$ | $2^6 \times 2^6$ |
| 64 | $2^9 \times 2^9$ | $2^6 \times 2^6$ |

The ability to use small crossbars, while still having many layers in the memory stack, is valuable. The electrical engineering characteristics associated with small crossbars (such as 64×64), are far easier to work with than those associated with large crossbars (such as 512×512). Additionally, having many layers of crossbars increases the bit density per unit area. With 6D addressing, small crossbars and many layers can be simultaneously accomplished.

Additionally, 6D addressing does not have holes in the address space. Since the memory cube used for 6D addressing has a simple (x,y,z) coordinate for each memristor in the memory cube, it should be obvious that if the $n^2 \times n^2 \times n^2$ dimensions of the cube are powers of 2, then every 6D address is in one-to-one correspondence with a physical memristor. Therefore, there are no holes in the memory space. In contrast, 4D addressing may have some addresses that do not address physical bits.

The 6D addressing architectures described also reduce the capacitive load of the CMOS circuits addressing and reading the memory. There are two factors that reduce the capacitive load seen by the CMOS sense amplifier and driver circuits when accessing a bit during 6D addressing, as compared with 4D addressing. First, due to the active devices (TFTs) on the upper layers in 6D addressing, it is possible to turn off all row and column wires on the non-selected layers. If there are H layers, this reduces the capacitive load by sqrt(H), in comparison with 4D addressing. For a system with H=16 layers, this is a reduction of 4× in capacitance. The ability to use small crossbars, which is enabled by 6D addressing, also reduces the capacitive load. The capacitance on a wire in a crossbar is proportional to its length, or equivalently, the number of memristors on the wire. If the layout is switched from the large crossbars (e.g., 512×512) required by 4D addressing to a small crossbar (e.g. 64×64) with 6D addressing, then the capacitance is reduced by a factor of 8×.

The two above factors are multiplied to get the total reduction factor for the capacitive load. The capacitive load affects the speed at which the read and write operations can take place.

The one enabler for 6D addressing is a controllable switch which can be placed on the same layers as the memristive crossbars. The example used above is an array of controllable switches formed using Thin-Film Transistors (TFT), but other implementations of such a switch (from, for example, NDR devices or memristors) are possible.

As discussed above, the number of vias V needed to access B bits is much smaller when using 6D addressing than when using 4D addressing. This reduction in the number of vias required permits smaller crossbars to be used. Reduction in the crossbar size eases several electrical engineering problems which arise in large crossbars. In particular, 6D addressing permits the capacitive load associated with a bit being accessed to be significantly reduced.

Figure 6:
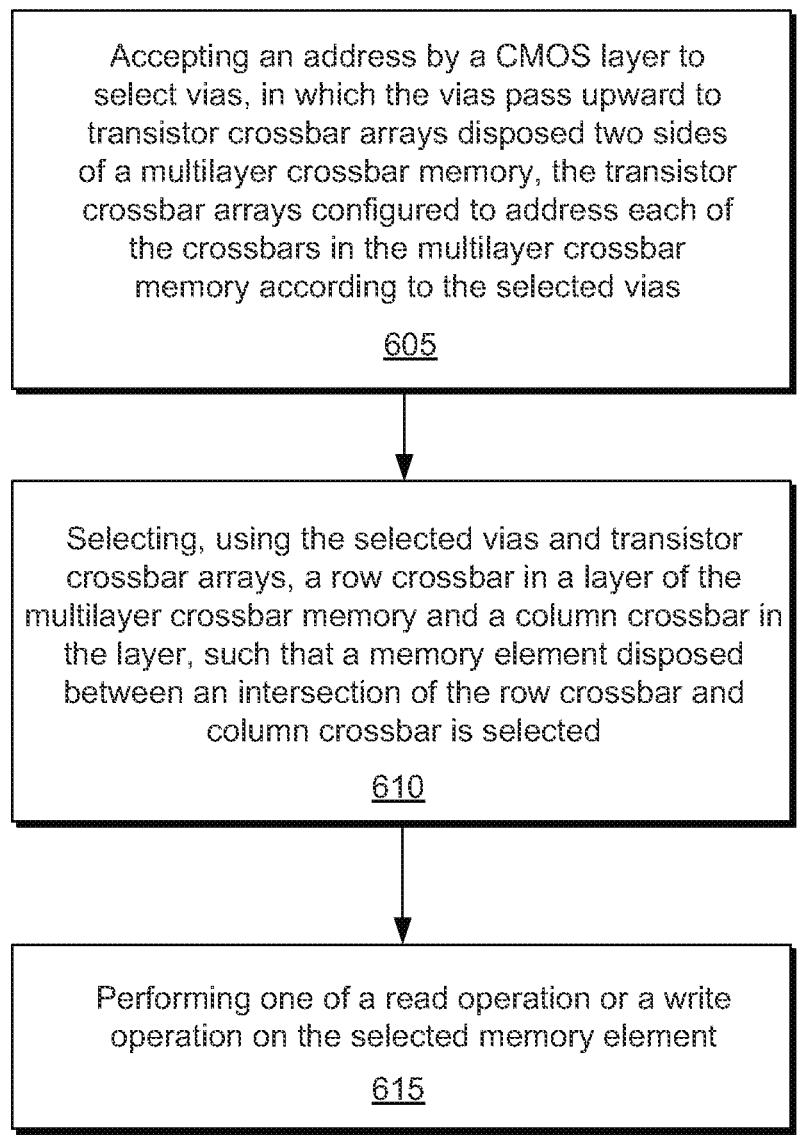
FIG. 6 is a flowchart of a method for addressing memory using a 6D addressing architecture, according to one example of principles described herein.

FIG. 6 is a flowchart (600) of a method for addressing memory using a 6D addressing architecture. The method includes accepting an address by a CMOS layer, the CMOS layer selecting vias. The vias pass upward to TFT crossbar arrays disposed two sides of a multilayer crossbar memory, the TFT crossbar arrays configured to address memristor crossbars in the multilayer crossbar memory according to the selected vias (block 605). In one implementation, a binary address that includes a plurality of k element vectors input into the CMOS layer. The binary address may include a two dimensional address comprising a crossbar row number and a first layer number and two dimensional address comprising a crossbar column number and a second layer number, in which the first layer number and the second layer number are identical. A plurality of multiplexers accept the vectors and each of multiplexer select output lines. Pairs of these output lines are connected to a CMOS transistor crossbar array which, in turn, selects vias connected to the TFT crossbar arrays.

Using the selected vias and TFT transistor crossbar arrays, a row crossbar in a layer of the multilayer crossbar memory and a column crossbar in the layer are selected. The memory element that is disposed between an intersection of the row crossbar and column crossbar is selected (block 610). A read or write operation can then be performed on the selected memory element (block 615). In some examples, only $4n^2$ vias are used to address $n^6$ memory elements in the multilayer memory.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A computer readable memory comprising:
   a circuit layer;
   a multilayer memory stacked over the circuit layer to form a memory box, the memory box comprising a bottom surface interfacing with the circuit layer and four side surfaces;
   a first switching crossbar array disposed on a first side of the memory box; and
   a plurality of vias connecting the circuit layer to the first switching crossbar layer;
   in which the first switching crossbar array accepts signals from the plurality of vias and selectively connects a crossbar in the multilayer memory to the circuit layer.

2. The memory of claim 1, further comprising a second switching crossbar array disposed on a second side of the memory box, in which the first and second switching crossbar arrays are perpendicular to the circuit layer and the switches in the first and second crossbar arrays directly connect to crossbars in the multilayer memory.

3. The memory of claim 2, in which the multilayer memory comprises stacked crossbar memory arrays and in which the first switching crossbar array and the second switching crossbar array are thin film transistor crossbar arrays directly connected to each of the crossbars in the multilayer memory.

4. The memory of claim 2, in which the first switching crossbar array selects a column crossbar in a layer of the multilayer memory and the second switching crossbar array selects a row crossbar in the layer of the multilayer memory, in which the column crossbar and the row crossbar intersect to address a memory element disposed between the column crossbar and the row crossbar.

5. The memory of claim 2, in which the plurality of vias comprise layer select vies disposed on third and fourth sides of the multilayer memory, the layer select vias being connected to the first switching array on the first side of the multilayer memory and the second switching array disposed on the second side of the multilayer memory.

6. The memory of claim 1, in which the circuit layer comprises a complimentary metal oxide semiconductor (CMOS) layer comprising a plurality of demultiplexers connected to a transistor crossbar array.

7. The memory of claim 6, in which the multiplexers and the transistor crossbar array are covered by the multilayer memory.

8. The memory of claim 1, in which $4n^2$ vies address $n^6$ memory elements in the multilayer memory.

9. The memory of claim 1, in which the multilayer memory comprises N layers, N rows in each layer, N columns in each layer, and $N^2$ memory elements in each layer.

* * * * *